(12) United States Patent
Chang et al.

(10) Patent No.: US 8,053,906 B2
(45) Date of Patent: Nov. 8, 2011

(54) SEMICONDUCTOR PACKAGE AND METHOD FOR PROCESSING AND BONDING A WIRE

(75) Inventors: Hsiao Chuan Chang, Kaohsiung (TW); Tsung Yueh Tsai, Kaohsiung (TW); Yi Shao Lai, Yonghe (TW); Ho Ming Tong, Taipei (TW); Jian Cheng Chen, Tainan County (TW); Wei Chi Yih, Taichung (TW); Chang Ying Hung, Kaohsiung (TW); Cheng Tsung Hsu, Pingtung County (TW); Chih Cheng Hung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 243 days.

(21) Appl. No.: 12/501,285

(22) Filed: Jul. 10, 2009

(65) Prior Publication Data

US 2010/0007009 A1    Jan. 14, 2010

Related U.S. Application Data

(60) Provisional application No. 61/079,811, filed on Jul. 11, 2008.

(30) Foreign Application Priority Data

Sep. 1, 2008   (TW) ............................... 97133402 A

(51) Int. Cl.
  *H01L 23/48*   (2006.01)
(52) U.S. Cl. ................ 257/780; 257/784; 257/E23.021; 257/E23.025

(58) Field of Classification Search .................. 257/780, 257/784, E23.021, E23.025
See application file for complete search history.

(56) References Cited

U.S. PATENT DOCUMENTS

| | | |
|---|---|---|
| 5,060,051 A | 10/1991 | Usuda |
| 5,216,278 A | 6/1993 | Lin et al. |
| 5,318,651 A | 6/1994 | Matsui et al. |
| 6,091,140 A | 7/2000 | Toh et al. |
| 6,329,722 B1 | 12/2001 | Shih et al. |
| 6,507,112 B1 | 1/2003 | Kurihara et al. |
| 7,404,513 B2 | 7/2008 | Kadoguchi et al. |
| 2002/0084516 A1 | 7/2002 | Efland et al. |
| 2003/0011068 A1 | 1/2003 | Song et al. |
| 2005/0054155 A1 | 3/2005 | Song et al. |
| 2005/0073057 A1 | 4/2005 | Tiziani et al. |
| 2005/0194674 A1 | 9/2005 | Thomas et al. |
| 2005/0224959 A1 | 10/2005 | Kwon et al. |
| 2005/0272487 A1 | 12/2005 | Lee |
| 2007/0029682 A1 | 2/2007 | Aoki et al. |
| 2008/0185737 A1* | 8/2008 | Marimuthu ................... 257/780 |
| 2008/0230877 A1 | 9/2008 | Chung et al. |
| 2008/0246113 A1 | 10/2008 | Baek et al. |
| 2009/0032947 A1 | 2/2009 | Na et al. |
| 2009/0087951 A1 | 4/2009 | Jeon et al. |
| 2009/0221104 A1 | 9/2009 | Yamaguchi et al. |

(Continued)

FOREIGN PATENT DOCUMENTS

CN           1417848       5/2003

(Continued)

*Primary Examiner* — Trung Q Dang

(57) ABSTRACT

A copper bonding wire includes a line portion and a non-spherical block portion. The non-spherical block portion is physically connected to the line portion, and the cross-sectional area of the non-spherical block portion is bigger than that of the line portion.

19 Claims, 10 Drawing Sheets

U.S. PATENT DOCUMENTS

2009/0236742 A1  9/2009  Low

FOREIGN PATENT DOCUMENTS

| CN | 1568543 | 1/2005 |
| CN | 1750257 | 3/2006 |
| CN | 1753159 | 3/2006 |
| CN | 1828890 | 9/2006 |
| CN | 1925146 | 3/2007 |
| CN | 101383335 | 3/2009 |
| JP | 57023246 | 2/1982 |
| JP | 8107123 | 4/1996 |
| TW | 200504902 | 2/2005 |

\* cited by examiner

SEMICONDUCTOR PACKAGE AND METHOD FOR PROCESSING AND BONDING A WIRE

CROSS REFERENCE TO RELATED APPLICATION

This application claims the priority benefit of U.S. patent application Ser. No. 61/079,811, filed on Jul. 11, 2008 and Taiwan Patent Application Serial Number 097133402, filed on Sep. 1, 2008, the full disclosure of which is incorporated herein by reference.

BACKGROUND OF THE INVENTION

1. Field of the Invention

The present invention generally relates to a copper bonding wire of a semiconductor package, and more particularly to a wire bonding structure of a semiconductor package, wherein a copper bonding wire includes a non-spherical block portion, whereby the bonding area between a pad and the copper bonding wire can be sufficiently maintained or increased.

2. Description of the Related Art

Referring to FIG. 1, according to a process for manufacturing a semiconductor package, the technology of wire bonding process widely applied to the electrical connection between a pad 11 of a chip 10 and a pad 13 of a substrate 12 by using a bonding wire 14. Wire bonding process is mainly based on gold (Au) wires, but copper (Cu) wire has an advantage of low cost. Compared with the gold, the copper has better electric conductivity and thermal conductivity, whereby the copper bonding wire has thinner diameter of wire and better dissipation of heat. However, the copper has disadvantage of insufficient ductility and easy oxidation such that the utilization of the copper bonding wire is restricted.

Recently, the copper bonding wire is only applied to a chip pad with a big size or low dielectric material (low-k) of wafer, because the success of the wire bonding process of the copper bonding wire depends on the structural strength of the chip pad. In order to avoid the failure of the wire bonding process of the copper bonding wire, the small size of the chip pad will be limited.

Referring to FIGS. 2 to 4, they depict a conventional method for bonding a copper bonding wire. Referring to FIG. 2, a copper bonding wire 20 is provided by a wire bonding machine, wherein the copper bonding wire 20 has a copper line 22 and a copper ball 24. The copper ball 24 is physically connected to an end of the copper line 22 by a discharging electricity manner or a burning hydrogen manner. Referring to FIG. 3, the copper ball 24 is pressed and then deformed. Referring to FIG. 4, the deformed copper ball 24 is bonded to an aluminum (Al) pad 32 by a vibration process. However, the hardness of the copper is higher than that of the aluminum, and thus the force resulted from the copper bonding wire 20 possibly damages the structure of the aluminum pad 32 during the pressing process. Furthermore, referring to FIG. 5, the boding interface 80 between the aluminum pad 32 and the copper bonding wire 20 in the prior art is a circular cross-section. If the exposed surface of the aluminum pad 32 is rectangular, the area of the circular cross-section cannot be nearly equal to the area of the exposed surface of the aluminum pad 32, i.e. the bonding area between the aluminum pad 32 and the copper bonding wire 20 cannot be sufficiently maintained. Accordingly, there exists a need for a copper bonding wire capable of solving the above-mentioned problems.

SUMMARY OF THE INVENTION

The present invention provides a wire bonding structure of a semiconductor package includes a copper bonding wire and a pad. A copper bonding wire includes a line portion and a non-spherical block portion, wherein the non-spherical block portion is physically connected to the line portion, and the cross-sectional area of the non-spherical block portion is bigger than that of the line portion. A pad is bonded to the non-spherical block portion, wherein the bonding interface between the pad and the non-spherical block portion is a non-circular cross-section.

The present invention further provides a method for processing a copper bonding wire comprising the following steps of: providing a copper bonding wire comprising a line portion and a block portion, wherein the block portion is physically connected to the line portion, and the cross-sectional area of the non-spherical block portion is bigger than that of the line portion; and pressing the block portion to be deformed to a non-spherical block portion.

According to the method for bonding a copper bonding wire of the present invention, the force resulted from the copper bonding wire can affect an external tool or mold during the pressing process, clipping process, molding process or patterning process. Thus, the force resulted from the copper bonding wire will not damage the structure of the pad. Furthermore, according to the wire bonding structure of the present invention, there is a bigger bonding area between the pad and the copper bonding wire, i.e. there is a bigger bonding force, thereby keeping sufficient the bonding force between the pad and the copper bonding wire.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1:
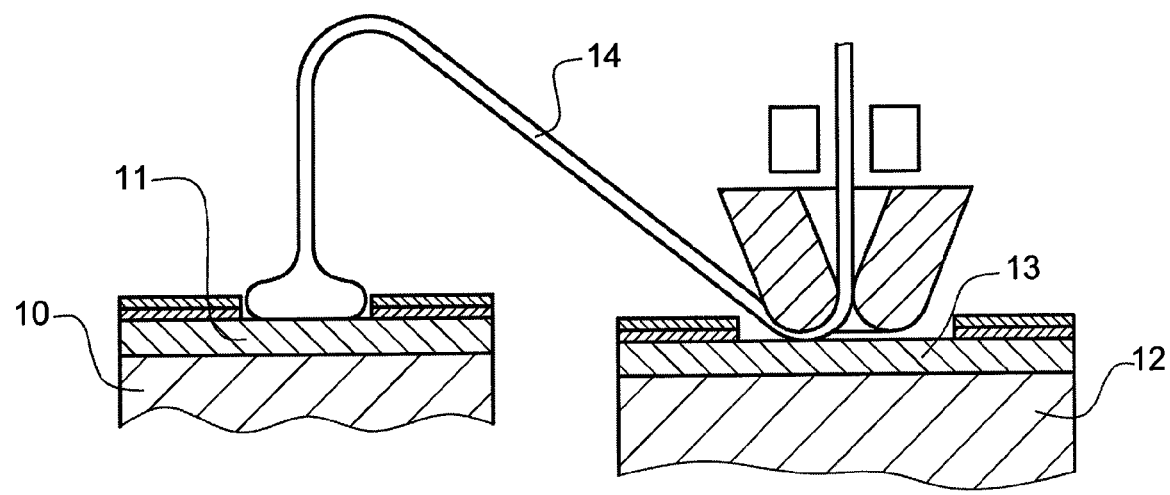
FIG. 1 is a cross-sectional views showing a method for bonding a wire in the prior art.
Figure 2:
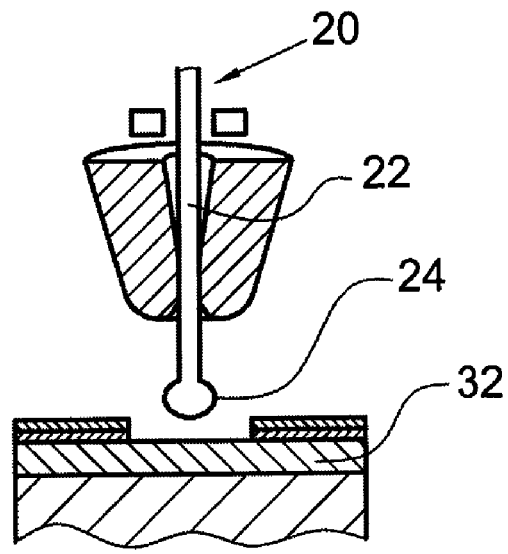
FIGS. 2 to 4 are cross-sectional views showing a method for bonding a copper bonding wire in the prior art.
Figure 3:
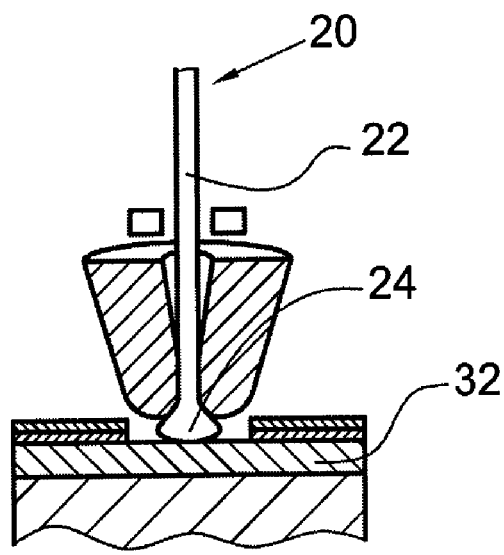
Figure 4:
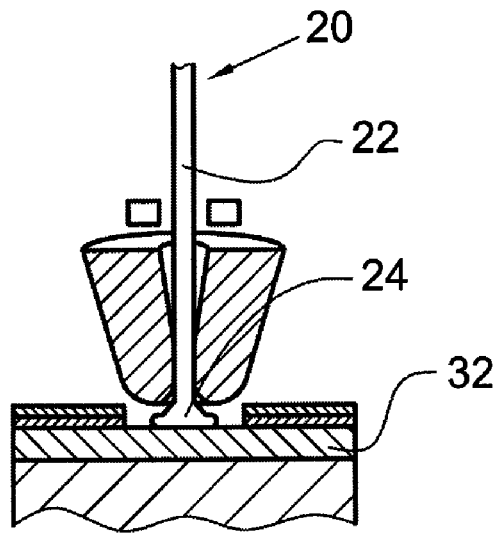
Figure 5:
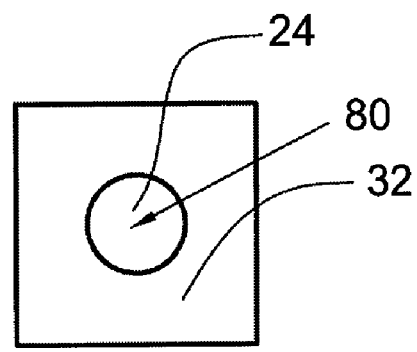
FIG. 5 is a cross-sectional view showing a bonding interface between an aluminum pad and a copper bonding wire of a wire bonding structure in the prior art.
Figure 6:
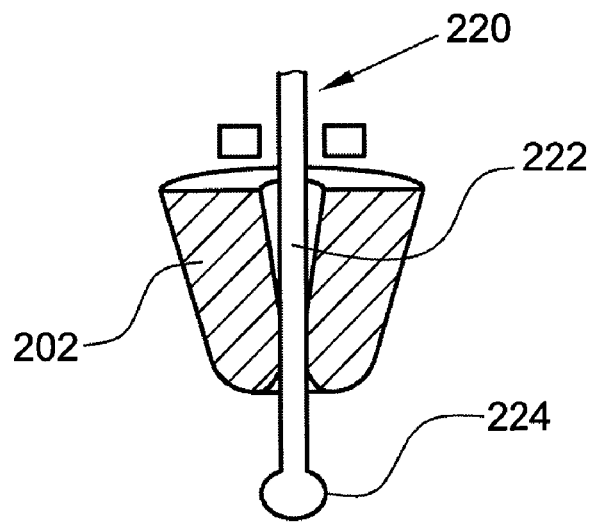
FIGS. 6 and 7a-7c are cross-sectional views showing a method for processing a copper bonding wire according to an embodiment of the present invention.
Figure 7A:
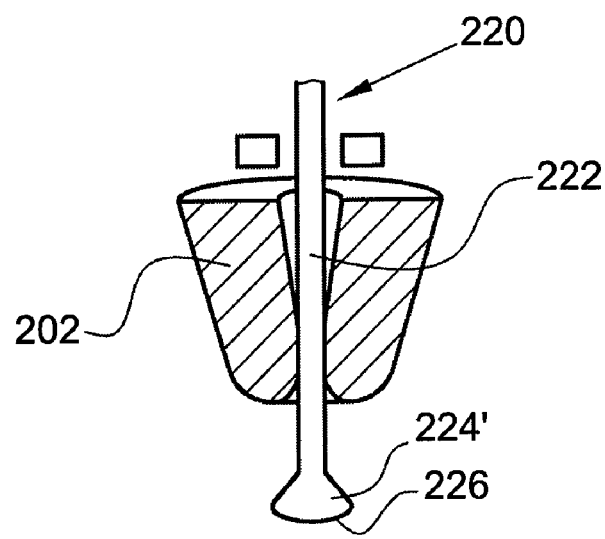
Figure 7B:
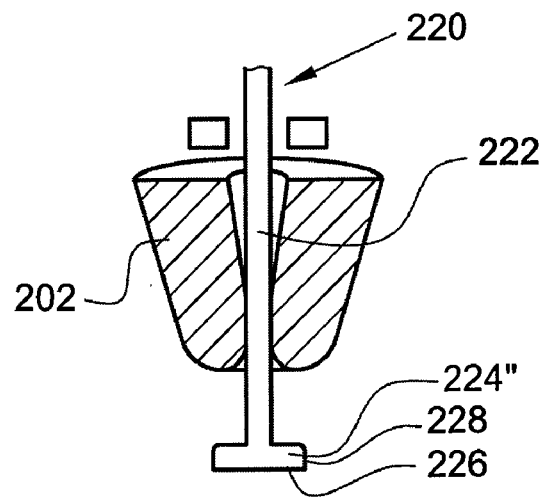
Figure 7C:
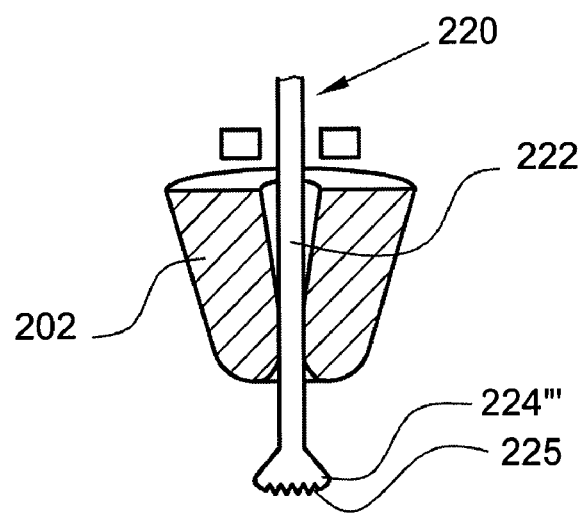

Referring to FIGS. 6 and 7a-7c, they depict a method for processing a copper bonding wire according to an embodiment of the present invention. Referring to FIG. 6, a copper bonding wire 220 is provided by a wire bonding machine 202, wherein the copper bonding wire 220 has a line portion 222 and a block portion 224, wherein the block portion 224 is physically connected to an end of the line portion 222, and the cross-sectional area of the block portion 224 is bigger than that of the line portion 222. Referring to FIGS. 7a-7c, the block portion 224 is pressed and then deformed to a non-spherical block portion 224', 224" and 224'" so as to form a copper bonding wire 220 of the present invention.

Figure 8:
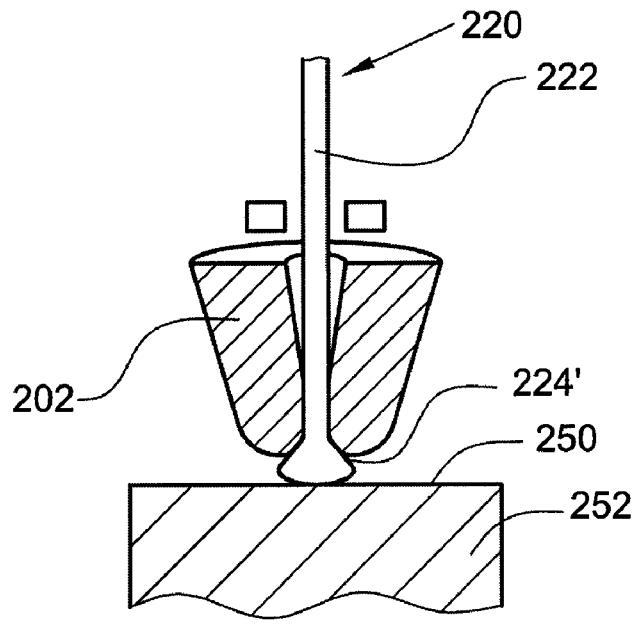
FIGS. 8 and 9 are cross-sectional views showing forming steps of a non-spherical portion of the copper bonding wire according to the embodiment of the present invention.
Figure 9:
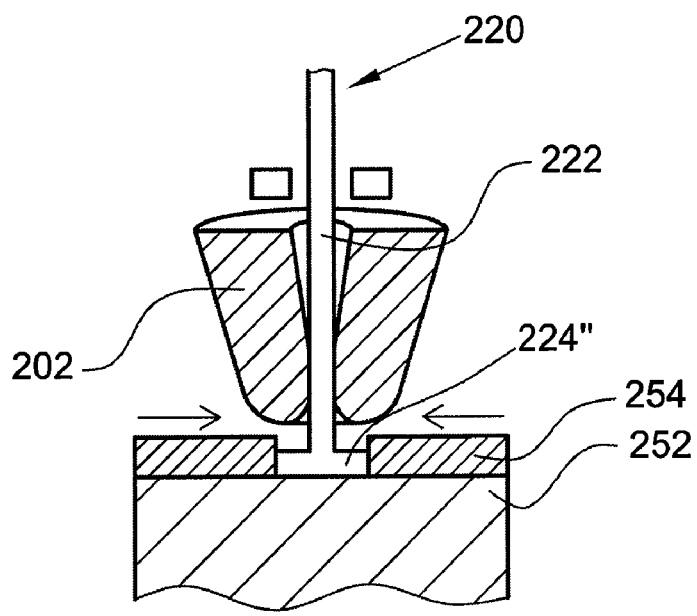

During the forming steps of the non-spherical block portion in this embodiment, the block portion 224 is physically connected to an end of the line portion 222 by a discharging electricity manner or a burning hydrogen manner. Then, the block portion 224 is moved for contacting a non-adhesive surface 250 of an external tool 252, and is pressed for being deformed to a non-spherical block portion 224' by a pressing process, shown in FIG. 8. The non-spherical block portion 224' has flat or rough bottom surface 226, shown in FIG. 7a. Or, the non-spherical block portion 224" is clipped leftward and rightward (shown in arrows), and then deformed to another non-spherical block portion 224" by a clipping tool 254 of a clipping process, shown in FIG. 9. The non-spherical block portion 224" has two or four flat side surfaces 228, shown in FIG. 7b.

Figure 10:
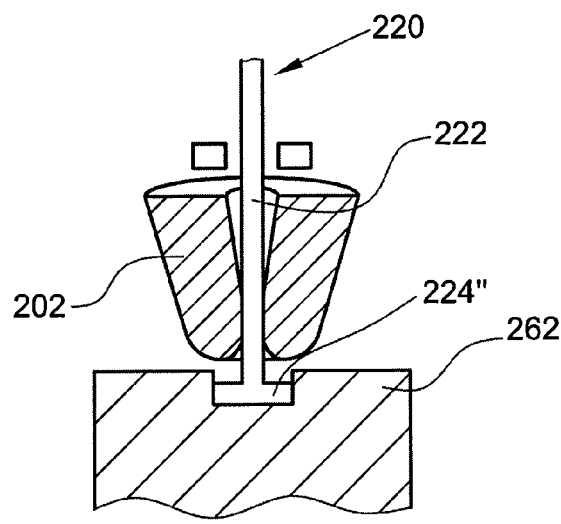
FIG. 10 is a cross-sectional view showing a forming step of a non-spherical portion of the copper bonding wire according to another embodiment of the present invention.

During the forming steps of the non-spherical block portion in another embodiment, the block portion 224 is also physically connected to an end of the line portion 222 by a discharging electricity manner or a burning hydrogen manner. Then, the block portion 224 is moved for contacting an interior 260 of an external mold 262, whereby the block portion 224 is deformed to a non-spherical block portion 224" by a molding process, shown in FIG. 10. The non-spherical block portion 224" has flat or rough bottom surface 226, and has two or four flat side surfaces 228, shown in FIG. 7b. It is noted that the block portion 224 must be inserted into the interior 260 of the external mold 262 when that the block portion 224 is soft at high temperature, whereby the block portion 224 is deformed to the non-spherical block portion 224", and the non-spherical block portion 224" must be drawn from the interior 260 of the external mold 262 in time so as to avoid uneasy separation between the mold 262 and the non-spherical block portion 224". The melting point of the mold 262 is more than that of the copper bonding wire 220.

Figures 11, 12, 13:
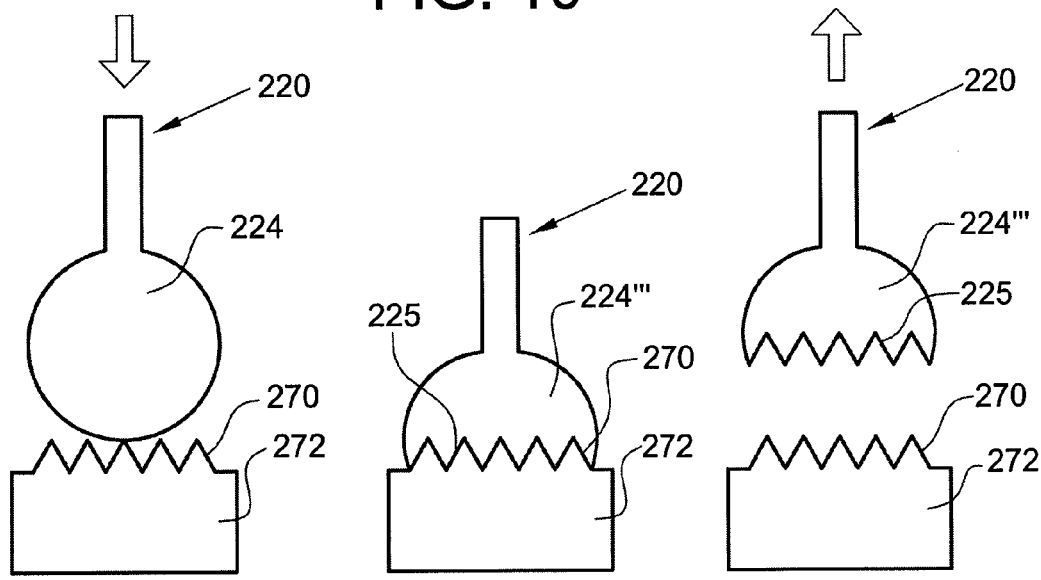
FIGS. 11 to 13 are cross-sectional views showing forming steps of a non-spherical portion of the copper bonding wire according to a further embodiment of the present invention.

During the forming steps of the non-spherical block portion in a further embodiment, the block portion 224 is also physically connected to an end of the line portion 222 by a discharging electricity manner or a burning hydrogen manner. Referring to FIGS. 11-13, then they depict a process for patterning a block portion. The block portion 224 is moved for contacting a patterned surface 270 of an external tool 272. If the hardness of the block portion 224 of the copper bonding wire 220 is less than that of the external tool 272, at least one first pattern 225 is formed on a bottom surface of the non-spherical block portion 224'" by the patterned surface 270 of the external tool 272 during the pressing process. The first pattern 225 is corresponding to the patterned surface 270 of the external tool 272 so as to form a non-spherical block portion 224'" having the first pattern 225, shown in FIG. 7c.

Figure 14:
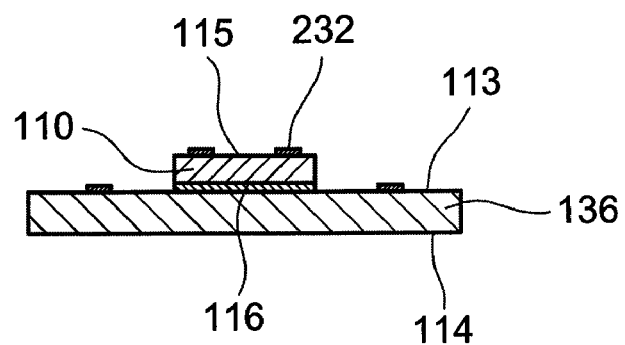
FIGS. 14, 15, 16a, and 16b are views showing a method for packaging a semiconductor package according to the first embodiment of the present invention.
Figure 15:
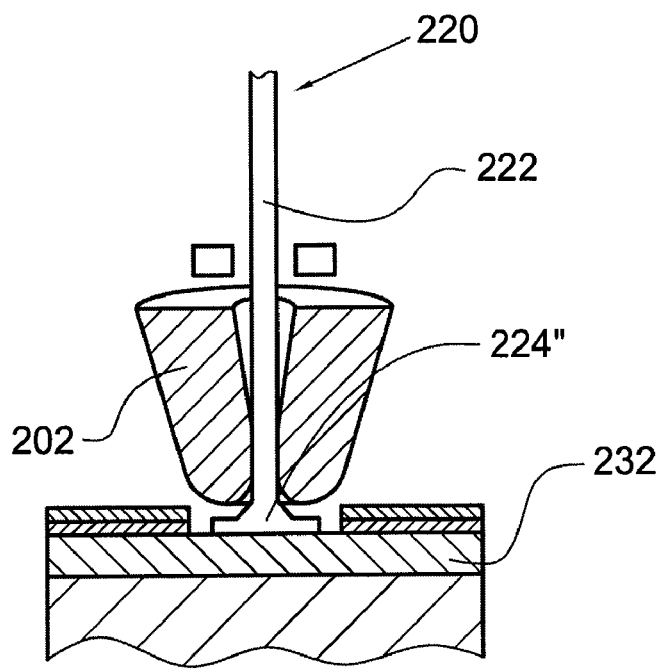
Figure 16A:
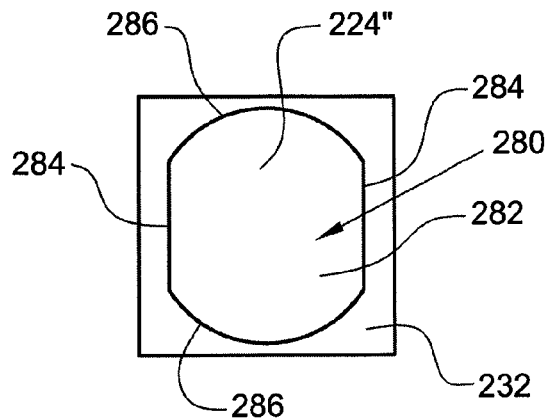
Figure 16B:
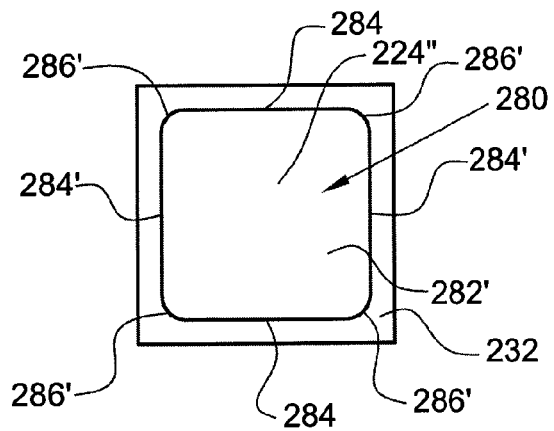

Referring to FIGS. 14-15, they depict a method for packaging a semiconductor package according to the first embodiment of the present invention. Referring to FIG. 14, a carrier 136 is provided, wherein the carrier 136 has an upper surface 113 and a lower surface 114 opposite to the upper surface 113. A chip 110 is disposed on the carrier 136, wherein the chip 110 has an active surface 115 and a back surface 116 opposite to the active surface 115, and the back surface 116 of the chip 110 is located on the upper surface 113 of the carrier 136. The chin 110 includes a pad 262 disposed on the active surface 115. Referring to FIGS. 7a and 7b again, a copper bonding wire 220 of the present invention is formed by pressing, clipping or molding process. The copper bonding wire 220 includes a non-spherical block portion 224', 224". Referring to FIG. 15 again, in this embodiment the non-spherical block portion 224" can be bonded to the pad 232 by a vibration process, so as to finish a method for bonding a bonding wire of the present invention and form a wire bonding structure of the present invention. The cross-section of the non-spherical block portion 224" is a non-circular cross-section 282, i.e. the bonding interface 280 between the pad 232 and the non-spherical block portion 224" is the non-circular cross-section 282. The non-circular cross-section 282 includes two straight lines 284 and two curved lines 286, shown in FIG. 16a, when the non-spherical block portion 224" has two flat side surfaces. Preferably, the non-circular cross-section 282' includes four straight lines 284' and four curved lines 286', shown in FIG. 16b, when the non-spherical block portion 224" has four flat side surfaces. If the exposed surface of the pad 232 is rectangular, the area of the non-circular cross-section 282' can be nearly equal to the area of the exposed surface of the pad 232, i.e. the bonding area between the pad 232 and the copper bonding wire 220 can be sufficiently maintained.

According to the method for bonding a copper bonding wire of the present invention, the force resulted from the copper bonding wire can affect an external tool or mold during the pressing process, clipping process or molding process. Thus, the force resulted from the copper bonding wire will not damage the structure of the pad. Furthermore, according to the wire bonding structure of the present invention, the bonding area between the pad and the copper bonding wire can be sufficiently maintained, thereby keeping sufficient the bonding force between the pad and the copper bonding wire.

Figure 17:
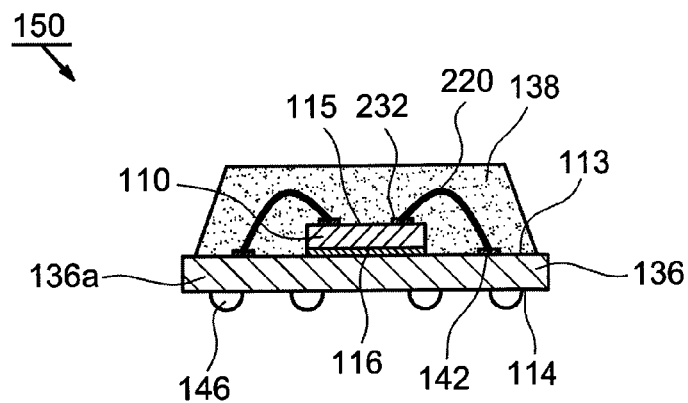
FIG. 17 is a cross-sectional view showing a bonding interface between a pad and a copper bonding wire of a wire bonding structure according to a method for packaging a semiconductor package in the first embodiment of the present invention.

In addition, the carrier 136 can be a substrate or a leadframe. Referring to FIG. 17, in this embodiment, the carrier 136 can be a substrate 136a. The wire bonding structure of the present invention can be applied to a semiconductor package, i.e. the pad 232 can be a chip pad, one end of the copper bonding wire 220 is electrically connected to the chip pad, and the other end of the copper bonding wire 220 is electrically connected to a substrate pad 142. The substrate 136a includes external electrical contacts 146 located on the second surface 114.

Referring to FIG. 17 again, finally the chip 110, the copper bonding wire 220 are sealed and the carrier 136 is covered by a molding compound 138 so as to form a package, i.e. a semiconductor package 150 of the present invention.

Figure 18:
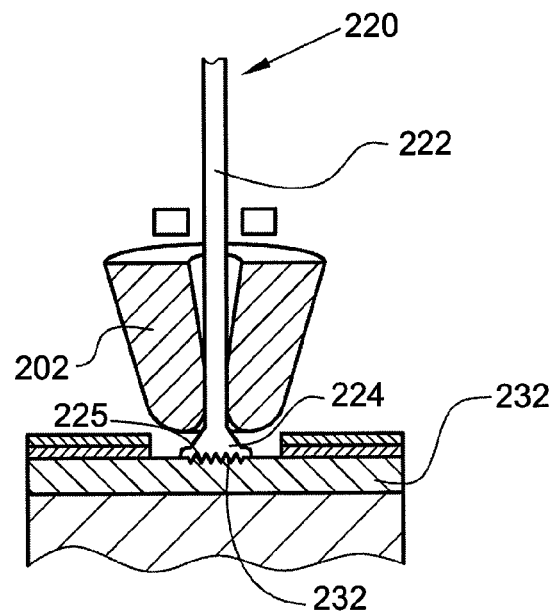
FIG. 18 is a cross-sectional view showing a method for bonding a copper bonding wire according to a method for packaging a semiconductor package in the second embodiment of the present invention, and showing that patterns of a pad and a non-spherical block portion have triangular saw-tooth-shaped cross-section.

Referring to FIG. 18, it depicts a method for bonding a copper bonding wire according to a method for packaging a semiconductor package in the second embodiment of the present invention. First, a copper bonding wire 220 of the present invention is formed by a patterning process. The copper bonding wire 220 includes a non-spherical block portion 224'", shown in FIG. 7c. Referring to FIG. 18 again, in this embodiment the non-spherical block portion 224'" is bonded to a pad 232 by a vibration process, so as to form a wire bonding structure of the present invention.

Figure 19:
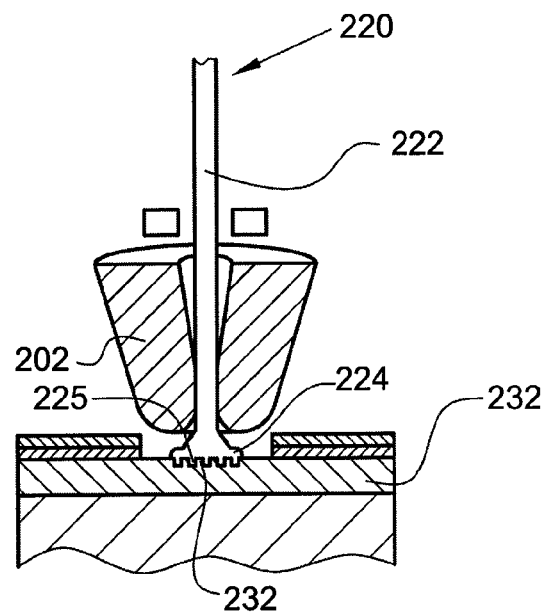
FIG. 19 is a cross-sectional view showing a method for bonding a copper bonding wire according to a method for packaging a semiconductor package in the second embodiment of the present invention, and showing that patterns of a pad and a non-spherical block portion have rectangular sawtooth-shaped cross-section.

If the hardness of the non-spherical block portion 224'" of the copper bonding wire 220 is more than that of the pad 232 (e.g. aluminum pad), at least one second pattern 233 is formed on a top surface of the pad 232 by the first pattern 225 on the bottom surface of the non-spherical block portion 224''', and the second pattern 233 is bonded to the first pattern 225. The first and second pattern 225, 233 can has sawtooth-shaped cross-section, e.g. triangular sawtooth-shaped cross-section (shown in FIG. 18) or rectangular sawtooth-shaped cross-section (shown in FIG. 19). Since the second pattern 233 of the pad 232 is bonded to the first pattern 225 of the block portion 224''', the bonding area between the pad 232 and the copper bonding wire 220 can be increased, i.e. there is a bigger bonding area between the pad 232 and the copper bonding wire 220.

According to the method for bonding a copper bonding wire of the present invention, the force resulted from the copper bonding wire can affect an external tool or mold during the pressing process, clipping process or molding process. Thus, the force resulted from the copper bonding wire will not damage the structure of the pad. Furthermore, according to the wire bonding structure of the present invention, there is a bigger bonding area between the pad and the copper bonding wire, i.e. there is a bigger bonding force, thereby keeping sufficient the bonding force between the pad and the copper bonding wire.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A semiconductor package comprising:
   a carrier;
   a chip disposed on the carrier, wherein the chip has a first surface and a second surface opposite to the first surface;
   a pad disposed on the first surface of the chip;
   a copper bonding wire comprising:
      a line portion; and
      a non-spherical block portion physically connected to the line portion, wherein the cross-sectional area of the non-spherical block portion is bigger than that of the line portion, the non-spherical block portion is bonded to the pad, and the bonding interface between the pad and the non-spherical block portion is a non-circular cross-section, and wherein the non-spherical block portion has a bottom surface provided with at least one first pattern, and the first pattern has a saw-toothed cross-section; and
   a molding compound for sealing the chip and the copper bonding wire and covering the carrier.

2. The semiconductor package as claimed in claim 1, wherein the bonding interface between the pad and the non-spherical block portion is the non-circular cross-section, which includes two straight lines and two curved lines.

3. The semiconductor package as claimed in claim 1, wherein the bonding interface between the pad and the non-spherical block portion is the non-circular cross-section, which includes four straight lines and four curved lines.

4. The semiconductor package as claimed in claim 1, wherein the pad has a top surface provided with at least one second pattern which is bonded to the first pattern.

5. The semiconductor package as claimed in claim 4, wherein the second pattern has a saw-toothed cross-section.

6. The semiconductor package as claimed in claim 4, wherein the hardness of the non-spherical block portion of the copper bonding wire is more than that of the pad.

7. A semiconductor package comprising:
   a carrier;
   a chip disposed on the carrier, wherein the chip has a first surface and a second surface opposite to the first surface;
   a pad disposed on the first surface of the chip;
   a copper bonding wire comprising:
      a line portion; and
      a non-spherical block portion physically connected to the line portion, wherein the cross-sectional area of the non-spherical block portion is bigger than that of the line portion, the non-spherical block portion is bonded to the pad, and the bonding interface between the pad and the non-spherical block portion is a non-circular cross-section; and
   a molding compound for sealing the chip and the copper bonding wire and covering the carrier,
   wherein the non-spherical block portion has a rough bottom surface.

8. The copper bonding wire as claimed in claim 1, wherein the non-spherical block portion has two flat side surfaces.

9. The copper bonding wire as claimed in claim 8, wherein the non-circular cross-section of the non-spherical block portion includes two straight lines and two curved lines.

10. The copper bonding wire as claimed in claim 1, wherein the non-spherical block portion has four flat side surfaces.

11. The copper bonding wire as claimed in claim 10, wherein the non-circular cross-section of the non-spherical block portion includes four straight lines and four curved lines.

12. A method for processing a copper bonding wire comprising the following steps of:
   providing a copper bonding wire comprising a line portion and a block portion, wherein the block portion is physically connected to the line portion, and the cross-sectional area of the block portion is bigger than that of the line portion; and
   pressing the block portion on a patterned surface of an external tool so as to form a non-spherical block portion that has a bottom surface provided with at least one pattern, wherein the pattern has a saw-toothed cross-section.

13. The method as claimed in claim 12, wherein the patterned surface of the external tool has a non-adhesive surface.

14. The method as claimed in claim 12, wherein the formation of the non-spherical block portion comprises:
   clipping the block portion for being deformed to a non-spherical block portion by a clipping process.

15. The method as claimed in claim 12, wherein the formation of the non-spherical block portion comprises:
   moving the block portion for contacting an interior of an external mold, whereby the block portion is deformed to a non-spherical block portion.

16. The method as claimed in claim 12, wherein the hardness of the block portion of the copper bonding wire is less than that of the external tool.

17. The semiconductor package as claimed in claim 1, wherein the pad has a rectangular shape defined by two first longitudinal sides and two first traverse sides, the non-circular cross-section has a shape defined by two second longitudinal sides and two second curved sides, and the first longitudinal sides are parallel to the second longitudinal sides.

18. The semiconductor package as claimed in claim 1, wherein the pad has a rectangular shape defined by two first longitudinal sides and two first traverse sides, the non-circular cross-section has a shape at least defined by two second longitudinal sides and two second traverse sides, the first longitudinal sides are parallel to the second longitudinal sides, and the first traverse sides are parallel to the second traverse sides.

19. The semiconductor package as claimed in claim 18, wherein the non-circular cross-section has the shape further defined by four curved sides, each the curved side connects with one of the second longitudinal sides and with one of the second traverse sides.

* * * * *